United States Patent [19]

Puzzolo et al.

[11] Patent Number: 5,866,461
[45] Date of Patent: Feb. 2, 1999

[54] METHOD FOR FORMING AN INTEGRATED EMITTER SWITCHING CONFIGURATION USING BIPOLAR TRANSISTORS

[75] Inventors: Santo Puzzolo, Catania CT; Raffaele Zambrano; Mario Paparo, both of San Giovanni La Punta CT, all of Italy

[73] Assignees: STMicroelectronics s.r.l., Agrate Brianza Mi; Consorzio Per La Ricerca Sulla Microelettronica Nel Mezzogiorno, Catania CT, both of Italy

[21] Appl. No.: 801,584

[22] Filed: Feb. 18, 1997

Related U.S. Application Data

[62] Division of Ser. No. 618,329, Mar. 19, 1996, abandoned, which is a continuation of Ser. No. 273,589, Jul. 11, 1994, Pat. No. 5,500,551, which is a division of Ser. No. 812,704, Dec. 23, 1991, Pat. No. 5,376,821.

[30] Foreign Application Priority Data

Dec. 30, 1990 [IT] Italy ................................. 22577/90 U

[51] Int. Cl.⁶ .............................................. H01L 21/8228
[52] U.S. Cl. .......................................... 438/323; 438/340
[58] Field of Search .................................... 438/322, 323, 438/324, 325, 327, 340; 148/DIG. 9, DIG. 10, DIG. 87

[56] References Cited

U.S. PATENT DOCUMENTS

| | | | |
|---|---|---|---|
| 3,617,827 | 11/1971 | Schmitz | 438/323 |
| 4,651,410 | 3/1987 | Feygenson | 438/323 |
| 4,889,822 | 12/1989 | Musumeci et al. | 438/340 |
| 5,376,821 | 12/1994 | Puzzolo et al. | 257/566 |

OTHER PUBLICATIONS

*A Power Transisitor with an Integrated Thermal Feedback Mechanism.* Blanchard, Richard A., MIT: Jul. 1970.

Primary Examiner—Tuan H. Nguyen
Attorney, Agent, or Firm—Wenderoth, Lind & Ponack, L.L.P.

[57] ABSTRACT

A bipolar power transistor and a low voltage bipolar transistor are combined in an emitter switching or a semibridge configuration in an integrated structure. In a version with non-isolated components, the components of the structure are totally or partially superimposed on each other, partly in a first epitaxial layer and partly in a second epitaxial layer, and the low voltage bipolar transistor is situated above the emitter region of the bipolar power transistor which is thus a completely buried active structure. In a version with isolated components, there are two P+ regions in an N– epitaxial layer. The first P+ region constitutes the power transistor base and encloses the N+ emitter region of the power transistor. The second P+ region encloses two N+ regions and one P+ region, constituting the collector, emitter, and base regions respectively of the low voltage transistor. A metallization on the front of the chip provides a connection between the collector contact of the low voltage transistor and the emitter contact of the power transistor.

5 Claims, 4 Drawing Sheets

METHOD FOR FORMING AN INTEGRATED EMITTER SWITCHING CONFIGURATION USING BIPOLAR TRANSISTORS

This is a divisional of Ser. No. 08/618,329, filed Mar. 19, 1996, now abandoned, which is a Rule 60 continuation of Ser. No. 08/273,589 filed Jul. 11, 1994, now U.S. Pat. No. 5,500,551, which is itself a Divisional of Ser. No. 07/812,704 filed Dec. 23, 1991 now U.S. Pat. No. 5,376,821.

FIELD OF THE INVENTION

The present invention relates to an integrated structure of a bipolar power transistor and a low voltage bipolar transistor in an emitter switching or semibridge configuration and associated manufacturing processes.

BACKGROUND OF THE INVENTION

The emitter switching configuration is a circuit configuration in which a low voltage transistor of the MOS or bipolar type interrupts the emitter current of a high voltage power transistor in order to switch it off, with the power transistor typically being a bipolar transistor. A semibridge configuration is a similar circuit configuration having a terminal which permits external connection to the collector of the low voltage transistor.

Heretofore, when low voltage transistors of the bipolar type have been employed in an emitter switching configuration, the circuit has been fabricated with discrete components. However, a low voltage transistor of the MOS type has been employed in the emitter switching configuration, with the components being integrated in the same chip of semiconductor material. An example of an integrated structure with a low voltage transistor of the MOS type in the emitter switching configuration is described in European Patent Application No. 0 322 041.

In addition to the advantages which an integrated circuit generally has, compared with an analog circuit provided with discrete components, an integrated form of an emitter switching circuit configuration:

has increased ruggedness of the bipolar power transistor with regard to the possibility of any reverse secondary breakdown phenomena (Es/B);

combines the speed performance of the low voltage transistor with the voltage and current capabilities of the driven transistor; and allows the direct driving of the system with linear logic circuits through the base of the low voltage transistor.

The integrated structure of a bipolar power transistor and a low voltage bipolar transistor in the emitter switching or semibridge configuration in accordance with the present invention allows the above advantages. In addition, as compared with the integrated structure with low voltage transistor of the MOS type described in the above-mentioned European patent application, it has the further advantage of being made by simpler and more economical manufacturing processes.

BRIEF DESCRIPTION OF THE DRAWINGS

The invention will be further clarified by the description given below and the annexed drawings of nonlimiting examples of embodiments of the invention, in which.

DETAILED DESCRIPTION OF PREFERRED EMBODIMENT

Figure 1:
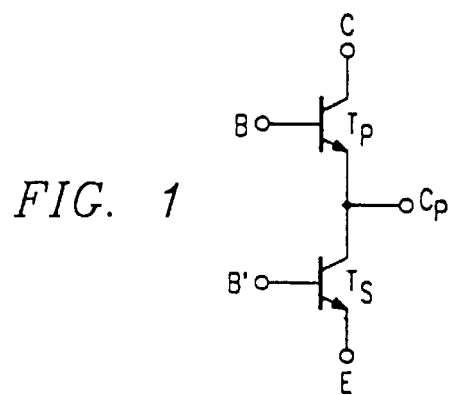
FIG. 1 shows schematically an equivalent electrical circuit of an integrated circuit in accordance with the present invention in a 5-terminal version.

FIG. 1 shows an electrical circuit equivalent of the integrated structure in a 5-terminal version of the present invention. This circuit comprises a bipolar power transistor Tp connected through its own emitter to the collector of a low voltage bipolar transistor Ts. The electrode Cp for connection to the collector of the low voltage transistor Ts and the emitter of power transistor Tp is not necessary for the emitter switching configuration while it is essential for operation of the circuit in a semibridge configuration. In the semibridge configuration, a current flows in the node Cp in one direction or the opposite direction depending on the conduction state of the transistors Tp and Ts, which, in order to avoid shorting to ground, cannot be in conduction at the same time. However, the terminal Cp can also be present in an emitter switching configuration in order to take the voltage present at the collector of the low voltage transistor or to prevent full saturation of the low voltage transistor. Thus, as the emitter switching configuration can be either a 4-terminal version or a 5-terminal version, and as the 5-terminal version can be employed as either an emitter switching configuration or a semibridge configuration, the term "emitter switching configuration" shall be considered herein to be the generic term except as otherwise indicated by the context.

Figure 2:
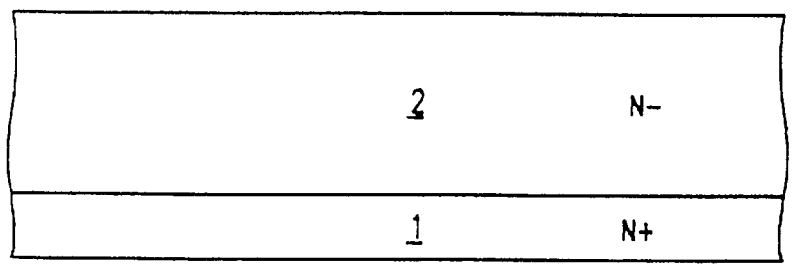
FIGS. 2–7 show schematically a structure at various stages of a manufacturing process for a superimposed components version in accordance with the present invention.
Figure 3:
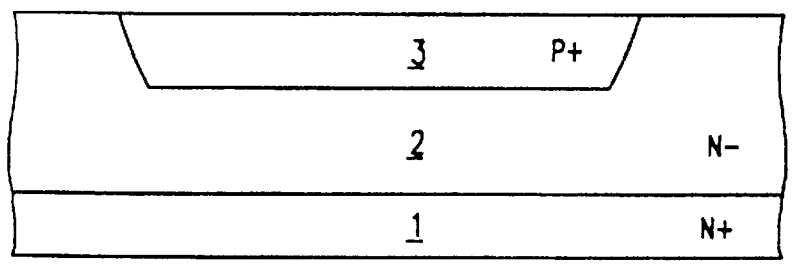
Figure 4:
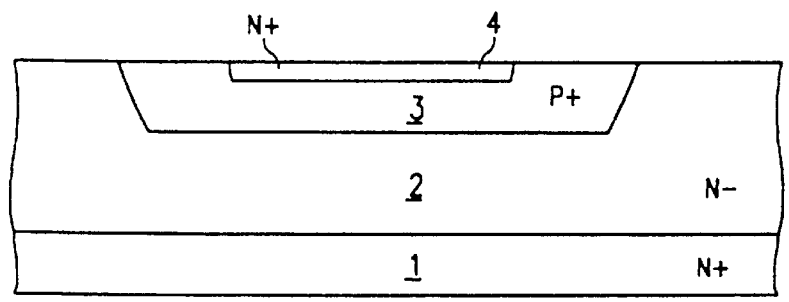
Figure 8:
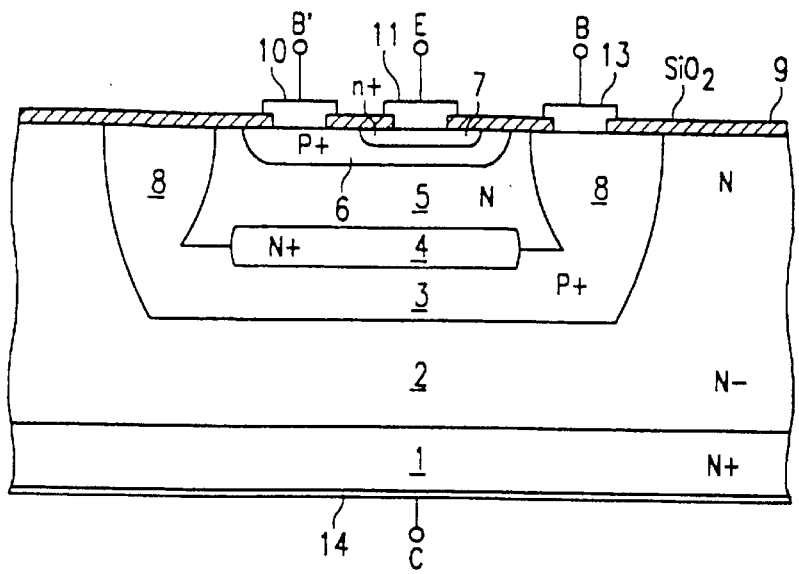
FIG. 8 shows schematically a 4-terminal structure at the end of the process represented by FIGS. 2–7.

A manufacturing process for the integrated structure in the version with superimposed components not isolated from each other as shown in FIG. 8, will now be described in detail. As a first step, a first epitaxial layer 2 with N– conductivity and high resistivity is grown on a N+ type silicon substrate 1 (FIG. 2). The substrate 1 has a first face which is to be the back face of the semiconductor chip. The epitaxial layer 2 is grown on the face of the substrate 1 which is opposite to the back face. An ion implantation and subsequent diffusion process can then be employed to produce a P+ type region 3 on the side of the layer 2 which is remote from substrate 1 (FIG. 3). Similarly, an N+ region 4 (FIG. 4) can then be produced on the side of layer 3 which is remote from substrate 1.

Figure 5:
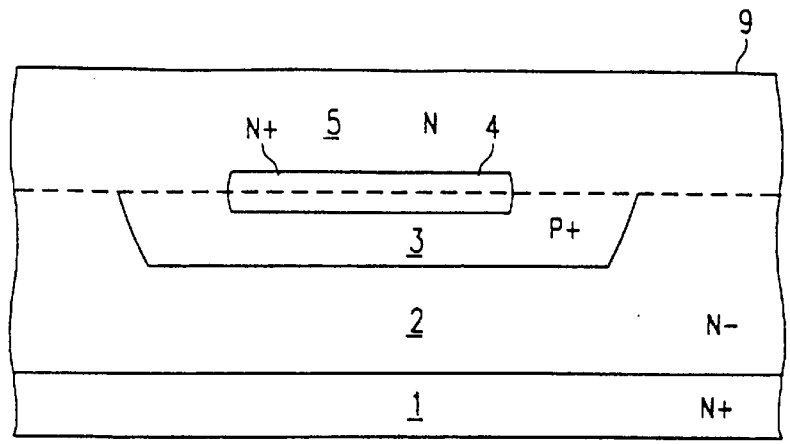
Figure 6:
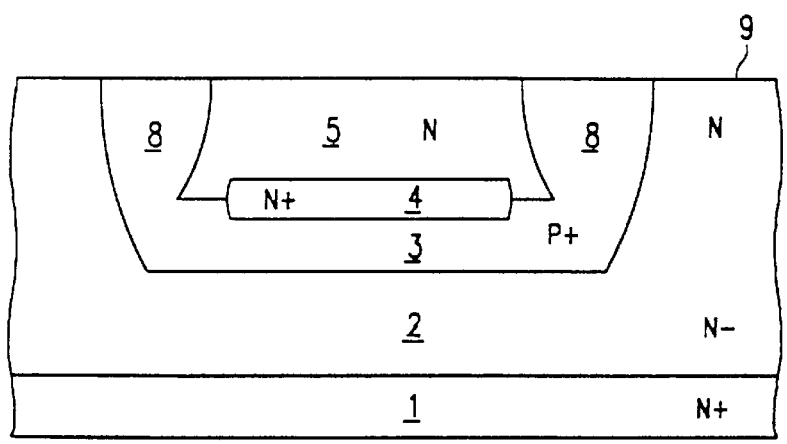

In the next stage, a second epitaxial layer 5 of N type material (FIG. 5) is grown on the side of the structure which is remote from substrate 1, with layer 5 bridging the exposed surfaces of regions 2, 3, and 4. The formation of the N type layer 5 causes the N+ region 4 to expand into layer 5. Then, known oxidation, photomasking, implantation and diffusion processes are used to define the P+ regions 8, which are positioned about the periphery of region 3 and extend inwardly from the front face 9 of the chip until they reach the region 3 as illustrated in FIG. 6. The P+ regions 8 connect the P+ region 3, constituting the base of the bipolar power transistor Tp, to the surface 9 of the chip.

Figure 7:
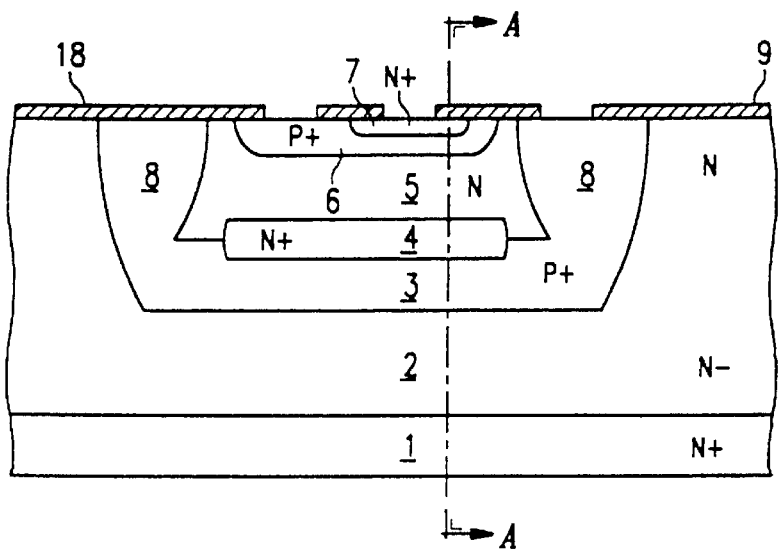

FIG. 7 shows the device after known techniques have been used to produce the P+ region 6, the N+ region 7, and the surface layer 18 containing thermal oxide SiO2. Region 6 and 7 are formed in the portion of the second epitaxial layer 5 which is encircled by regions 4 and 8, with region 7 being at the front face of the chip and separated from the remainder of that portion of layer 5 by region 6. The portion of the second epitaxial layer 5 between region 4 and region 6 serves as the collector of the low voltage transistor Ts. The P+ region 6 and the N+ region 7 make up the base and emitter, respectively, of the bipolar NPN low voltage transistor indicated by Ts in the equivalent circuit of FIG. 1.

As shown in FIG. 7, the emitter of the power transistor Tp consists of the N+ region 4, which is completely buried. The collector 5 of the low voltage transistor Ts is thereby connected directly to the emitter 4 of the power transistor Tp. The combination of the substrate 1 and the remainder of the epitaxial layer 2 after the formation of regions 3 and 4 constitutes the collector of power transistor Tp.

Following the stage of FIG. 7, the metallizations 10, 11, 13 and 14 are deposited at their respective locations of the chip to ensure ohmic contact with the regions 6, 7, 8 and the substrate 1, respectively, and to constitute the terminals B', E, B and C, respectively, which correspond to the identically named terminals of FIG. 1.

The final structure resulting from the process described above is shown in FIG. 8. As illustrated in FIG. 8, the final structure is an emitter switching configuration circuit integrated in a single chip of semiconductor material. The chip has a front or top face and a back or bottom face, with the back face being the outer surface of substrate 1.

The original composite formed by substrate 1 and epitaxial layer 2 has been converted to a modified substrate having a back face and a second face opposite the back face, and having a first region 1, 2, a second region 3, and at least part of a third region 4, as such regions are illustrated in the "final" condition in FIG. 8. The first region 1, 2 in the modified substrate has a first type of conductivity, which in the illustrated embodiment is N type, and constitutes the collector of the power transistor Tp. The second region 3 in the modified substrate is at least partially contiguous to the second face of the modified substrate and is separated from the back face by the first region 1, 2. The second region 3 has a second type of conductivity which is opposite to that of the first region. In the embodiment illustrated in FIG. 8, this second type of conductivity is the P type. The second region 3 constitutes the base region of the power transistor Tp. The third region 4 is contiguous to the second face and is separated from the first region 1, 2 by the second region 3. The third region 4 has the first type of conductivity and constitutes the buried emitter of the power transistor Tp.

The surface of the second epitaxial layer, on the side thereof which is remote from the first epitaxial layer 2, serves as the front face of the semiconductor chip. The second epitaxial layer, which bridged the first region 2, the second region 3, and the third region 4 on the side thereof remote from the back face, has also been converted to a modified epitaxial layer containing a fourth region, at least one fifth region 8, and a sixth region. The fourth region has the first type of conductivity and is the portion of the original second epitaxial layer not converted to the fifth and sixth regions. The fifth region 8, having the second type of conductivity, extends inwardly from the front face of the chip and is connected to the peripheral contour of the second region 3 so as to collectively encircle the sixth region.

The sixth region is the portion of the original second epitaxial layer 5 which is collectively encircled by the second and fifth regions. The sixth region has three portions. The first portion of the sixth region has the first type of conductivity and constitutes the collector of the low voltage transistor Ts. The first portion of the sixth region separates the second portion of the sixth region from the third region 4, while the second portion of the sixth region separates the first portion of the sixth region from the third portion of the sixth region. The second portion 6 of the sixth region is at least partially contiguous to the front face of the chip, has the second type of conductivity, and constitutes the base of the low voltage transistor Ts. The third portion 7 of the sixth region is contiguous to the front face of the chip, has the first type of conductivity, and constitutes the emitter of the low voltage transistor Ts.

A first metallization 10 deposited on the front face of the chip is in contact with the second portion 6 of the sixth region and constitutes the base electrode B' of the low voltage transistor Ts. A second metallization 11 deposited on the front face of the chip is in contact with the third portion 7 of the sixth region and constitutes the emitter electrode E of the low voltage transistor Ts. A third metallization 13 deposited on the front face of the chip is in contact with the fifth region 8 and constitutes the base electrode B of the power transistor Tp. A fourth metallization 14 is deposited on the back face of the chip and constitutes the collector electrode C of the power transistor Tp.

Figure 8A:
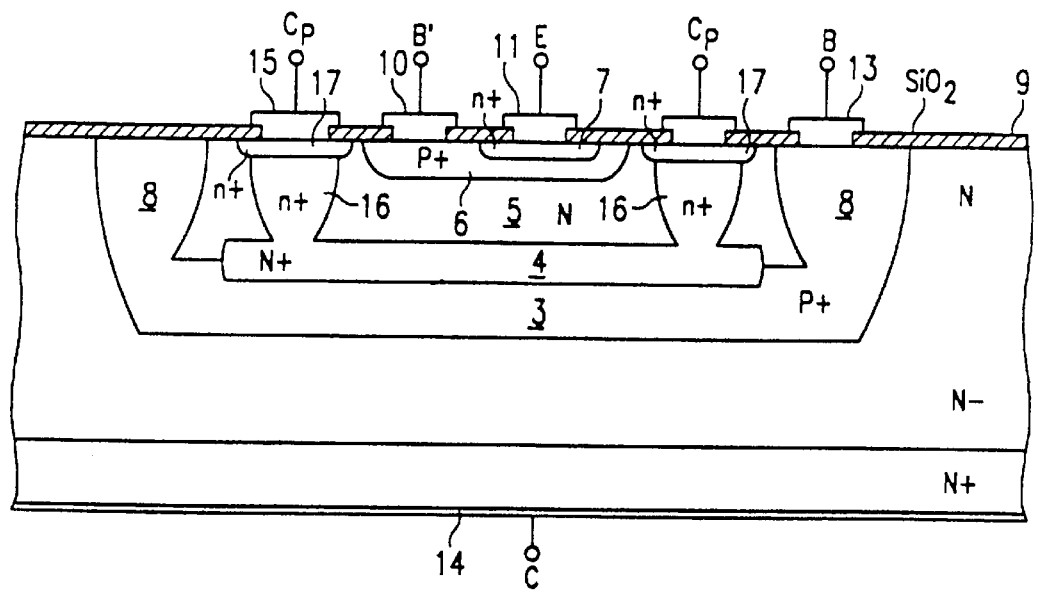
FIG. 8a shows schematically a 5-terminal structure at the end of the process represented by FIGS. 2–7 with the addition of the sinker regions and the overlying contact Cp.

If the structure of FIG. 8 is to be used in the semibridge configuration, it must be integrated with the regions which allow access through an added terminal Cp to the buried emitter region 4 of the power transistor Tp. For this purpose the manufacturing process described above can be modified as follows. After the steps which lead to the structure of FIG. 6, known photomasking, implantation and diffusion processes can be used to provide the N+ sinker regions (the regions 16 of FIG. 8a) which extend inwardly from the front face surface of the chip until they reach the buried third region 4. The definition of the P+ region 6 (i.e., the second portion of the sixth region) and of the N+ regions indicated by reference numbers 7 and 16 (i.e., the third portion of the sixth region and the sinker regions) in FIG. 8a, can then be carried out. The regions 17 are sinker enriched portions of sinkers 16 aimed at improving the contacts and reducing the electrical resistance of the sinker. After the last steps of metallization and provision of the electrodes, the resulting structure appears as shown in FIG. 8a. The metallization 15 on the front face of the chip constitutes electrode Cp for connection through the sinker regions 16 to the region 4.

Figure 9:
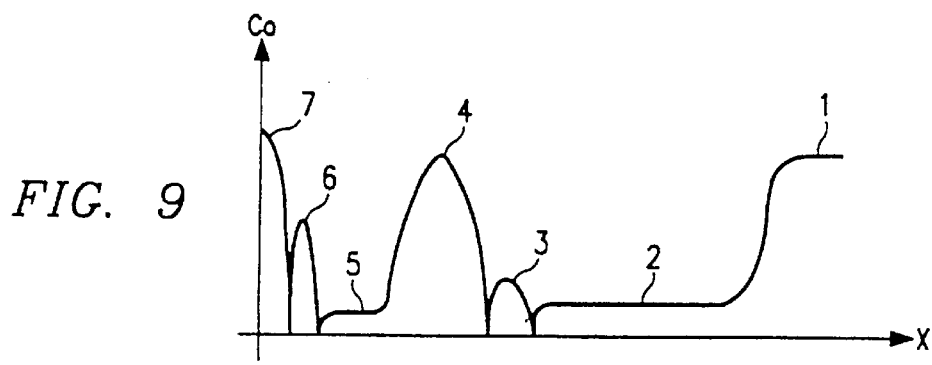
FIG. 9 shows schematically a profile of the concentrations of the various types of dopant along a section of the structure of FIG. 7, FIGS. 10–11 show schematically a structure during the various stages of a manufacturing process for an isolated components (not superimposed) version in accordance with the present invention.

The profile of the concentration (Co) of the various types of dopant in the different regions of the structure, along the line A—A of FIG. 7, is illustrated in FIG. 9, where the distance from the upper surface of the chip is shown on the X axis.

Figure 10:
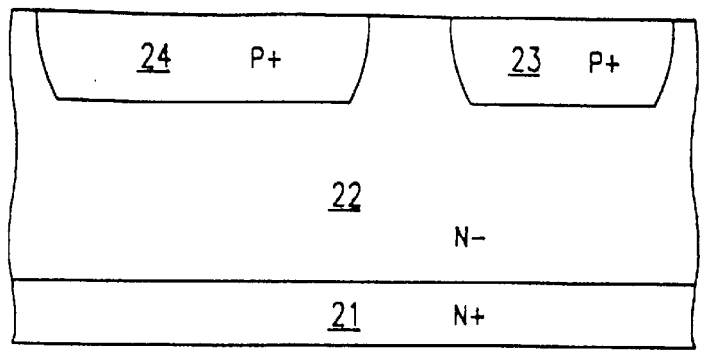
Figure 11:
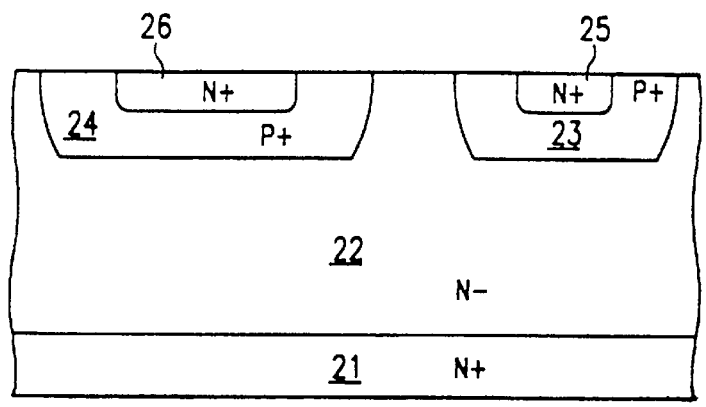
Figure 12:
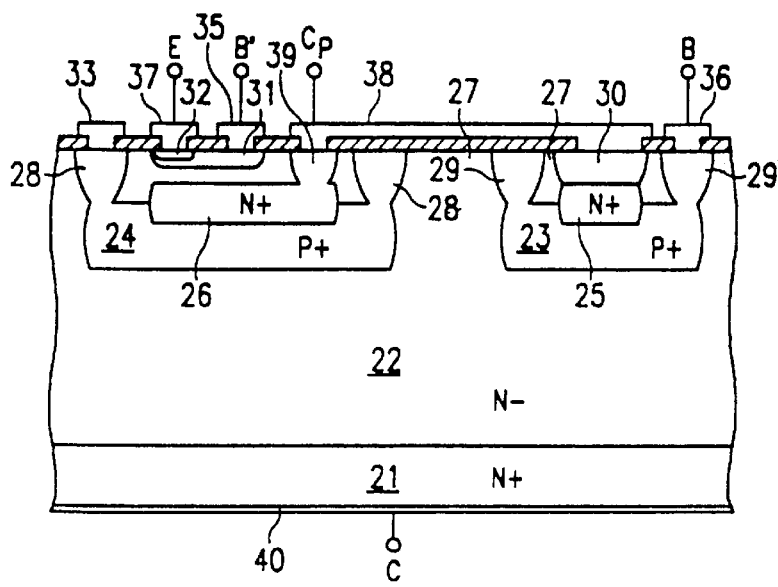
FIG. 12 shows schematically a structure at the end of the process represented by FIGS. 10–11.

A manufacturing process for forming a version of the integrated structure having isolated nonsuperimposed components calls for the following steps, illustrated in FIGS. 10–12. An N-epitaxial layer 22, with high resistivity is grown on an N+ type silicon substrate 21 (FIG. 10). The substrate 21 has a first face which is defined as the back face of the chip. The epitaxial layer 22 is grown on the face of the substrate 21 which is opposite the back face. Then known processes (e.g., deposition or implantation and subsequent diffusion) can be used to simultaneously create two P+ regions 23 and 24 at spaced apart locations on the face of the epitaxial layer 22 which is remote from substrate 1. Region 23 is designed to be the base of the power transistor Tp and the region 24 is designed for the formation of the isolation region of the low voltage transistor Ts.

The use of the same diffusion process to simultaneously form the regions 23 and 24 enables these regions to have the same junction depth. This has the effect of maximizing the current carrying capacity of the final device for a given operating voltage.

Known oxidizing, photomasking, deposition or implantation and subsequent diffusion processes are then used to form an N+ region 25 in the region 23. The N+ region 25 constitutes the emitter of the power transistor Tp. At the same time an N+ region 26 can be provided in the region 24 (FIG. 11). Region 26 is designed to act as the collector for the low voltage transistor Ts.

A N type epitaxial layer 27 is then grown, followed by the provision of a P+ region 28 (which is necessary for the isolation of the low voltage transistor Ts), and a P+ region 29 (which is necessary for the connection to the surface of the base region 23 of the power transistor Tp). N+ regions 30 and 39 are then provided for connection of the emitter region 25 of the power transistor Tp and the collector 26 of the low voltage transistor Ts, respectively, to the chip surface.

Subsequently, a P+ region 31 is formed for the base of the low voltage transistor Ts, and an N+ region 32 is formed for the emitter of the low voltage transistor Ts.

Finally the metallizations 33, 35, 36, and 37, designed to ensure ohmic contact with the underlying regions of semiconductor material and to constitute the electrode of the isolation region for low voltage transistor Ts and the electrodes B', B, and E, respectively, are deposited at their respective locations on the front face of the chip, while metallization 40 is deposited on the rear face of the chip to constitute the electrode C.

The aforesaid metallizations also call for the formation of a track 38 for the connection of the collector 26 of the low voltage transistor Ts to the emitter 25 of the power transistor Tp of FIG. 12, so as to provide a connection of the two transistors in the configuration of FIG. 1.

Thus the original composite formed by substrate 21 and epitaxial layer 22 has been converted to a modified substrate having a first region 21, 22, a second region 23, a third region 24, a fourth region 25, and a fifth region 26, as such regions are illustrated in the "final" condition in FIG. 12. The first region 21, 22 in the modified substrate has a first type of conductivity, which in the illustrated embodiment is the N type, and constitutes the collector of the power transistor Tp. The second and third regions are at least partially contiguous to the second face of the layer 22 at spaced apart positions. The fourth and fifth regions are also contiguous to the second face of the layer 22. The second region 23 in the modified substrate is separated from the back face by the first region 21, 22. The second region 23 has a second type of conductivity which is opposite to the first type of conductivity. In the embodiment illustrated in FIG. 12, this second type of conductivity is the P type. The second region 23 constitutes the base region of the power transistor Tp. The third region 24 has the second type of conductivity and constitutes the isolation region of the low voltage transistor Ts. The second region 23 is positioned between the first region 22 and the fourth region 25. The fourth region 25 has the first type of conductivity, and constitutes the emitter of the power transistor Tp. The third region 24 is positioned between the first region 22 and the fifth region 26. The fifth region 26 has the first type of conductivity and constitutes the collector of the low voltage transistor Ts.

The original second epitaxial layer, which bridged the first region 22, the second region 23, the third region 24, the fourth region 25, and the fifth region 26 on the side thereof remote from the back face, has also been converted to a modified epitaxial layer containing a sixth region 27, a seventh region 28, an eighth region 31, a ninth region 32, a tenth region 29, an eleventh region 30, and a twelfth region 39, as these regions are illustrated in FIG. 12.

The sixth region 27 has the first type of conductivity, and is the balance of the second epitaxial layer after the formation of the seventh through the twelfth regions. The seventh region 28 has the second type of conductivity and extends from the front face of the chip through the sixth region 27 to join the third region 24 along the peripheral contour of the third region 24. The eighth region 31 has the second type of conductivity and is positioned in the portion of the second epitaxial layer 27 which is surrounded by the seventh region 28. The eighth region 31 constitutes the base of the low voltage transistor Ts.

The ninth region 32, which has the first type of conductivity, is positioned on the side of the eighth region 31 which is remote from the back face. The ninth region 32 constitutes the emitter of the low voltage transistor Ts. The tenth region 29 has the second type of conductivity and is positioned in the second epitaxial layer 27, extending inwardly from the front face of the chip to join with the second region 23 along the peripheral contour of the second region 23, to carry the base of the power transistor Tp to the front face of the chip. The eleventh region 30, having the first type of conductivity, is positioned in the portion of the second epitaxial layer 27 which is surrounded by the tenth region 29, to bring the emitter region 25 of the power transistor Tp to the front face of the chip. The twelfth region 39 has the first type of conductivity and is positioned in the portion of the second epitaxial layer which is surrounded by the seventh region 28, to carry the collector region 26 of the low voltage transistor Ts to the front face of the chip.

Metallizations 37, 35, and 36, on the front face of the chip, are in contact with the ninth region 32, with the eighth region 31, and the tenth region 29, respectively, and constitute the emitter electrode E of the low voltage transistor Ts, the base electrode B' of the low voltage transistor Ts, and the base electrode B of the power transistor Tp, respectively. Metallization 40 on the back face of the chip constitutes the collector electrode C of the power transistor Tp. The metallic track 38 connects the eleventh region 30 to the twelfth region 39, to thereby connect the collector 26 of the low voltage transistor Ts to the emitter 25 of the power transistor Tp.

The terminal emitter switching structure requires therefore four terminals, of which three are on the front or upper surface of the chip and the fourth is on the back or lower surface of the chip.

The addition of terminal Cp at the metallization 38 permits the connection of the collector of the transistor Ts of FIG. 1 to an external circuit in the use of the pair of transistors Tp-Ts in a semibridge operation.

In both the configuration with superimposed components and the configuration with nonsuperimposed components, the terminal Cp can also be present in the emitter switching configuration in order to take the voltage present on the collector of low voltage transistor Ts, or to prevent full saturation of the low voltage transistor Ts through control of its base current (antisaturation circuit) and thus speed up its switching.

Numerous modifications, adaptations, variations and substitutions of components with other functionally equivalent ones are possible for the embodiments described above by way of illustration without thereby going beyond the protective scope of the present invention. For example, the growth of the first epitaxial layer on the substrate could be unnecessary if a substrate with characteristics equivalent to those of the substrata mentioned above (substrata 1 of FIG. 2 and 21 of FIG. 10) is adopted after growth of the first epitaxial layer.

In addition, although the present invention is illustrated for a structure with NPN transistors, it also applies, with variations apparent to those skilled in the art, to structures with PNP transistors provided, in this latter case, that the process starts with a type P substrate. The processes described lend themselves naturally to the simultaneous production on the same integrated circuit chip of several pairs of bipolar transistors Tp and Ts. This finds application, for example, in semibridge structures for control of direct current or step motors (for which two pairs are sufficient) and for control of three-phase current motors (for which three pairs are needed).

In these cases all the transistors Tp are provided on the same substrate and therefor have a common collector terminal, while the electrodes of each pair provided on the front of the chip can be connected together and to the external circuitry depending on design requirements.

We claim:

1. A process for manufacturing a circuit structure integrated in a single chip of semiconductor material and comprising a bipolar power transistor and a low voltage bipolar transistor connected in an emitter switching configuration, which comprises:

providing a first semiconductor substrate having a first face, which is to be the back face of the chip, and a second face which is opposite said first face;

creating in said first semiconductor substrate a first region and a second region; said second region being contiguous to said second face and being separated from said back face by said first region, said first region having a first type of conductivity and constituting the collector of said power transistor, said second region having a second type of conductivity which is opposite said first type of conductivity;

creating in a portion of said second region, which is contiguous to said second face and is remote from said first region, a third region, with the balance of said second region constituting the base of said power transistor; said third region having said first type of conductivity and constituting the emitter of said power transistor;

growing an epitaxial layer on said second face to bridge said first, second and third regions; said epitaxial layer having a face on the side thereof which is remote from said first semiconductor substrate to serve as the front face of the resulting chip;

creating in said epitaxial layer a fourth region, at least one fifth region, and a sixth region; said fourth region having said first type of conductivity, said at least one fifth region having said second type of conductivity and extending from said front face inwardly to the periphery of said second region so as to collectively enclose said sixth region;

creating in said sixth region a first portion, a second portion, and a third portion; said second portion of said sixth region being separated from said third region by said first portion of said sixth region, said third portion of said sixth region being separated from said first portion of said sixth region by said second portion of said sixth region, said first portion of said sixth region having said first type of conductivity and constituting the collector of said low voltage transistor, said second portion of said sixth region having second type of conductivity and constituting the base of said low voltage transistor, said third portion of said sixth region having said first type of conductivity and constituting the emitter of said low voltage transistor;

depositing a first metallization on said front face of the chip in contact with said second portion of said sixth region to constitute the base electrode of said low voltage transistor;

depositing a second metallization on said front face of the chip in contact with said third portion of said sixth region to constitute the emitter electrode of said low voltage transistor;

depositing a third metallization on said front face of the chip in contact with said at least one fifth region to constitute the base electrode of said power transistor; and depositing a fourth metallization on said back face of the chip to constitute the collector electrode of said power transistor.

2. A process in accordance with claim 1 further comprising forming in said first portion of said sixth region at least one sinker region extending inwardly from said front face to said third region, to thereby carry said third region to said front face of the chip, and depositing a fifth metallization on said front face in contact with said at least one sinker region to constitute an electrode for connection to said third region.

3. A process in accordance with claim 1 wherein said first type of conductivity is an N type conductivity, and wherein said second type of conductivity is a P type conductivity.

4. A method of forming an integrated circuit comprising:

(a) growing at least one first-conductivity-type epitaxial layer on a first-conductivity-type semiconductor substrate;

(b) introducing second-conductivity-type dopants in a portion of said at least one first-conductivity type epitaxial layer to form a power transistor base diffusion;

(c) introducing first-conductivity-type dopants in a portion of said power transistor base diffusion to form a power transistor emitter diffusion which overlies and is more shallow than said power transistor base diffusion;

(d) growing a further first-conductivity-type epitaxial layer which buries said power transistor emitter and base diffusions;

(e) forming ohmic contact to said power transistor base diffusion;

(f) introducing second-conductivity-type dopants in a portion of said further first-conductivity-type epitaxial layer to form a low voltage transistor base diffusion, and introducing first-conductivity-type dopants in a portion of said low voltage transistor base diffusion to form a low voltage transistor emitter diffusion which is surrounded by said low voltage transistor base diffusion;

(g) wherein a remaining portion of said further first-conductivity-type epitaxial layer constitutes a low voltage transistor collector which is directly connected to said power transistor emitter diffusion and results in an emitter-switching relationship.

5. The method of claim 4, wherein said first-conductivity-type is N-type and said second-conductivity-type is P-type.

* * * * *